(12) United States Patent
Kokubo et al.

(10) Patent No.: US 12,703,908 B2
(45) Date of Patent: Aug. 11, 2026

(54) SURFACE TREATMENT APPARATUS AND SURFACE TREATMENT METHOD

(71) Applicant: Shibaura Machine Co., Ltd., Chiyoda-ku (JP)

(72) Inventors: Mitsunori Kokubo, Numazu (JP); Satoshi Fukuyama, Numazu (JP); Yoshiaki Kurihara, Sunto-gun (JP); Takeshi Namba, Sunto-gun (JP)

(73) Assignee: Shibaura Machine Co., Ltd., Chiyoda-ku (JP)

( * ) Notice: Subject to any disclaimer, the term of this patent is extended or adjusted under 35 U.S.C. 154(b) by 628 days.

(21) Appl. No.: 18/040,235

(22) PCT Filed: Jul. 12, 2021

(86) PCT No.: PCT/JP2021/026086

§ 371 (c)(1),
(2) Date: Feb. 1, 2023

(87) PCT Pub. No.: WO2022/030189

PCT Pub. Date: Feb. 10, 2022

(65) Prior Publication Data

US 2023/0304143 A1 Sep. 28, 2023

(30) Foreign Application Priority Data

Aug. 5, 2020 (JP) ................................. 2020-133192

(51) Int. Cl.
*H01J 37/32* (2006.01)
*C23C 14/34* (2006.01)
(Continued)

(52) U.S. Cl.
CPC ............ *C23C 14/505* (2013.01); *C23C 14/34* (2013.01); *C23C 14/56* (2013.01);
(Continued)

(58) Field of Classification Search
None
See application file for complete search history.

(56) References Cited

U.S. PATENT DOCUMENTS 5,421,979 A 6/1995 Stevenson
6,471,837 B1 * 10/2002 Hans .................... C23C 14/566 204/298.25

(Continued)

FOREIGN PATENT DOCUMENTS

CN 1918321 A 2/2007
CN 102017096 A 4/2011

(Continued)

OTHER PUBLICATIONS

Combined Chinese Office Action and Search Report issued Nov. 28, 2024 in Chinese Patent Application No. 202180057590.X with English translation, 16 pgs.

(Continued)

*Primary Examiner* — Jason Berman
(74) *Attorney, Agent, or Firm* — Oblon, McClelland, Maier & Neustadt, L.L.P.

(57) ABSTRACT

In a surface treatment apparatus, a conveyance device houses a placement device having a treated member placed thereon, into a housing unit. A rotation device rotates the treated member to face a direction facing a surface treatment device in a predetermined rotation pattern, in a state in which the placement device is housed in the housing unit.

10 Claims, 9 Drawing Sheets

(51) Int. Cl.
*C23C 14/50* (2006.01)
*C23C 14/56* (2006.01)

(52) U.S. Cl.
CPC .. *H01J 37/32513* (2013.01); *H01J 37/32743* (2013.01); *H01J 37/32899* (2013.01)

(56) References Cited

U.S. PATENT DOCUMENTS

| | | | |
|---|---|---|---|
| 2001/0014268 A1 | 8/2001 | Bryson, III et al. | |
| 2008/0029023 A1* | 2/2008 | Ikeda | G11B 7/265 118/52 |
| 2008/0141943 A1 | 6/2008 | Matsumoto et al. | |
| 2011/0226178 A1 | 9/2011 | Tsuji et al. | |
| 2014/0014039 A1 | 1/2014 | Naito et al. | |
| 2016/0237555 A1 | 8/2016 | Mai et al. | |
| 2019/0090341 A1 | 3/2019 | Takahashi et al. | |
| 2022/0228254 A1 | 7/2022 | Matsumoto et al. | |

FOREIGN PATENT DOCUMENTS

| | | | |
|---|---|---|---|
| CN | 103443912 | A | 12/2013 |
| CN | 105793976 | A | 7/2016 |
| CN | 107022738 | A | 8/2017 |
| JP | 4-231 464 | A | 8/1992 |
| JP | 2009-108384 | A | 5/2009 |
| JP | 2009-108419 | A | 5/2009 |
| JP | 2010-87238 | A | 4/2010 |
| JP | 2018-31044 | A | 3/2018 |
| TW | 202138594 | A | 10/2021 |
| WO | WO 2005/075701 | A1 | 8/2005 |
| WO | WO 2009/057680 | A1 | 5/2008 |
| WO | WO 2017/159838 | A1 | 9/2017 |

OTHER PUBLICATIONS

Japanese Decision to Grant a Patent issued Mar. 11, 2025 in Japanese Patent Application No. 2020-133192 (with English translation), 3 pages.

International Search Report mailed on Sep. 21, 2021 in PCT/JP2021/026086 filed on Jul. 12, 2021 (3 pages).

Taiwanese Office Action dated Feb. 9, 2022 in Taiwanese Application 110128490 (24 pages).

Taiwanese Office Action dated Aug. 17, 2022 in Taiwanese Application 110128490 (27 pages).

* cited by examiner

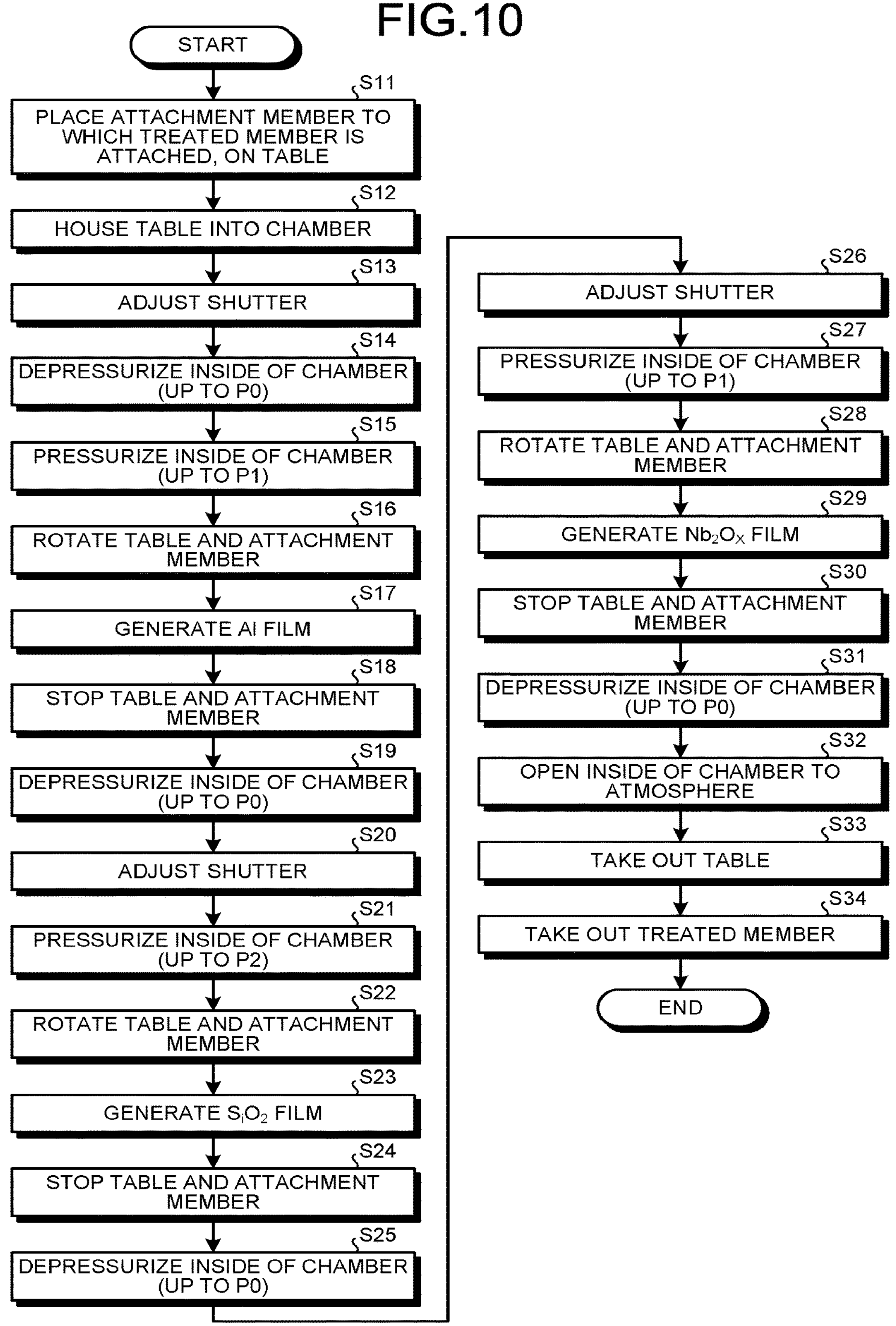
FIG.10
START
S11
PLACE ATTACHMENT MEMBER TO WHICH TREATED MEMBER IS ATTACHED, ON TABLE
S12
HOUSE TABLE INTO CHAMBER
S13
ADJUST SHUTTER
S14
DEPRESSURIZE INSIDE OF CHAMBER (UP TO P0)
S15
PRESSURIZE INSIDE OF CHAMBER (UP TO P1)
S16
ROTATE TABLE AND ATTACHMENT MEMBER
S17
GENERATE Al FILM
S18
STOP TABLE AND ATTACHMENT MEMBER
S19
DEPRESSURIZE INSIDE OF CHAMBER (UP TO P0)
S20
ADJUST SHUTTER
S21
PRESSURIZE INSIDE OF CHAMBER (UP TO P2)
S22
ROTATE TABLE AND ATTACHMENT MEMBER
S23
GENERATE $S_iO_2$ FILM
S24
STOP TABLE AND ATTACHMENT MEMBER
S25
DEPRESSURIZE INSIDE OF CHAMBER (UP TO P0)
S26
ADJUST SHUTTER
S27
PRESSURIZE INSIDE OF CHAMBER (UP TO P1)
S28
ROTATE TABLE AND ATTACHMENT MEMBER
S29
GENERATE $Nb_2O_X$ FILM
S30
STOP TABLE AND ATTACHMENT MEMBER
S31
DEPRESSURIZE INSIDE OF CHAMBER (UP TO P0)
S32
OPEN INSIDE OF CHAMBER TO ATMOSPHERE
S33
TAKE OUT TABLE
S34
TAKE OUT TREATED MEMBER
END

SURFACE TREATMENT APPARATUS AND SURFACE TREATMENT METHOD

CROSS-REFERENCE TO RELATED APPLICATIONS

This application is a national stage application of International Application No. PCT/JP2021/026086, filed Jul. 12, 2021, which designates the United States, incorporated herein by reference, and which claims the benefit of priority from Japanese Patent Application No. 2020-133192, filed Aug. 5, 2020, the entire contents of which are incorporated herein by reference.

TECHNICAL FIELD

The present invention relates to a surface treatment apparatus and a surface treatment method for performing surface treatment such as plasma irradiation onto a treated member.

BACKGROUND ART

Conventionally, a surface treatment apparatus that forms a metallic catalyst layer, a functional group, or the like by performing cleaning or property modification of the surface of a treated member using plasma, and a surface treatment apparatus that forms a thin film on the surface of a treated member using a sputtering apparatus have been known.

For example, a film formation apparatus described in Patent Literature 1 performs necessary surface treatment after conveying a plurality of substrates set on a wheeled platform, into the film formation apparatus. In addition, plasma treatment described in Patent Literature 2 has been known as an example of surface treatment.

CITATION LIST

Patent Literature

Patent Literature 1: JP H4-231464 A
Patent Literature 2: WO 2017/159838 A

SUMMARY OF INVENTION

Problem to be Solved by the Invention

Because the film formation apparatus described in Patent Literature 1 has a structure suitable for performing surface treatment of a large number of treated members, and is large in scale, the film formation apparatus has been unsuitable for production from small-scale production to medium-scale production. In addition, in performing surface treatment of a treated member, it is desirable that one apparatus can perform different types of surface treatment such as sputtering and plasma treatment described in Patent Literature 2.

The present invention has been devised in view of the foregoing, and aims to provide a surface treatment apparatus and a surface treatment method that are suitable for performing surface treatment of material in amount from a small amount to a medium amount.

Means for Solving Problem

In order to solve the above-described problem and achieve the object, a surface treatment apparatus according to the present invention, includes: a housing unit for housing a treated member; a placement device on which the treated member is placed; a conveyance device for housing the placement device having the treated member placed thereon, into the housing unit; a surface treatment device for performing at least one type of surface treatment on the treated member housed in the housing unit; and a rotation device for rotating the treated member to face a direction facing the surface treatment device in a predetermined rotation pattern, in a state in which the placement device is housed in the housing unit.

Effect of the Invention

The surface treatment apparatus according to the present invention brings about an effect of being suitable for performing surface treatment of a treated member in amount from a small amount to a medium amount.

BRIEF DESCRIPTION OF DRAWINGS

FIG. 10 is a flowchart illustrating an example of a flow of processing to be performed when a surface treatment apparatus performs surface treatment on a treated member.

DESCRIPTION OF EMBODIMENTS

Hereinafter, an embodiment of a surface treatment apparatus according to the present disclosure will be described in detail based on the drawings. Note that the invention is not limited by this embodiment. In addition, components in the following embodiment include components that can be replaced or easily conceived by the one skilled in the art, or substantially equivalent components.

An embodiment of the present disclosure is an example of a surface treatment apparatus 10 that generates a functional group on the surface of a treated member W (work) formed of resin material, for example, by irradiating the surface of the treated member W with plasma, and then forms a thin film using sputtering on the surface of the treated member W on which film adhesion is improved by the generation of the functional group. Note that the treated member W is a member formed of resin material such as plastic resin.

1. Description of Overall Configuration of Surface Treatment Apparatus

Figure 1:
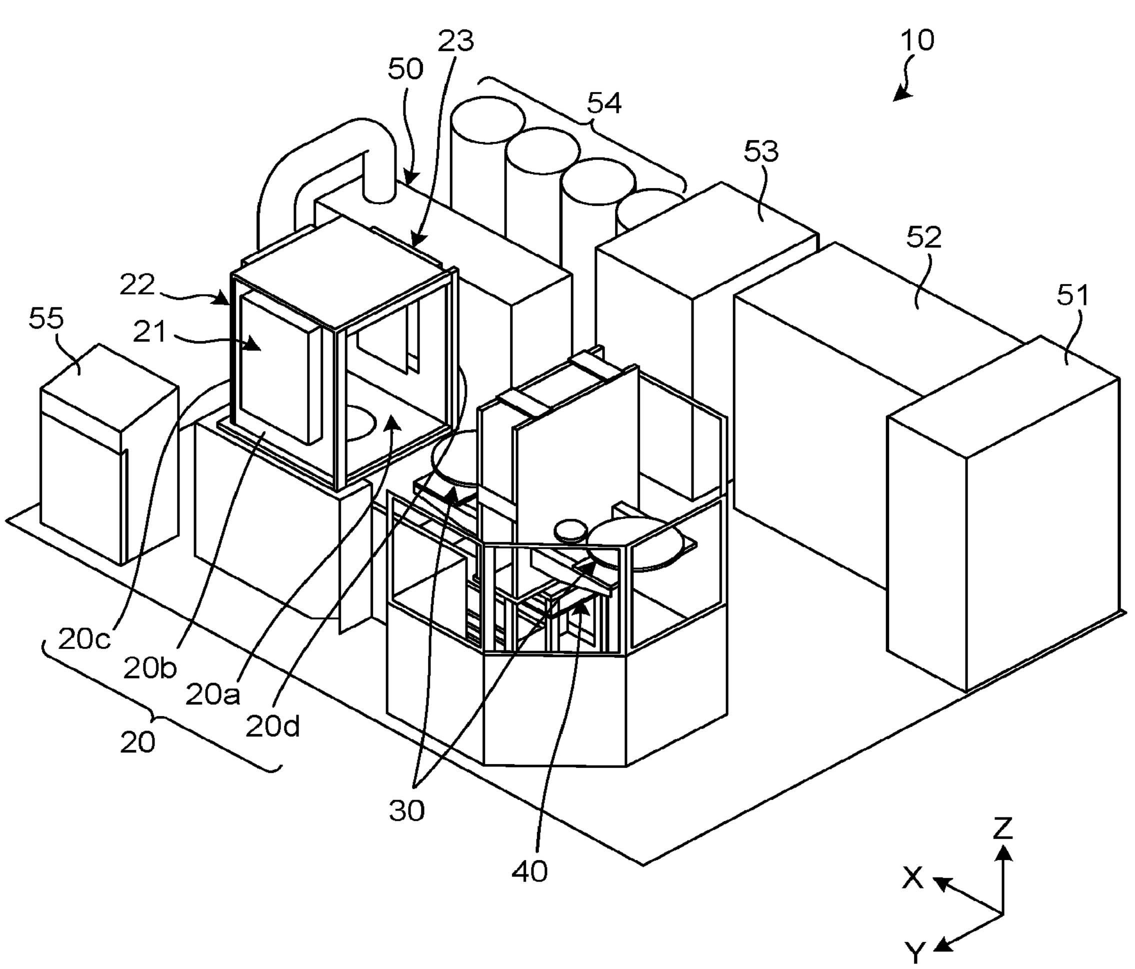
FIG. 1 is an external view of a surface treatment apparatus according to an embodiment.

First of all, a schematic structure of the surface treatment apparatus 10 will be described using FIG. 1. FIG. 1 is an external view of a surface treatment apparatus according to an embodiment.

As illustrated in FIG. 1, the surface treatment apparatus 10 includes a chamber 20, a treated member placement portion 30, and a treated member conveyance unit 40. In addition, an exhaust apparatus 50 is included on the rear side of the chamber 20. Furthermore, the surface treatment apparatus 10 includes a cooling apparatus 51, a control apparatus 52, a power supply apparatus 53, a gas supply apparatus 54, and a console panel 55 that are illustrated in FIG. 1.

The chamber 20 is a hermetically-sealed reaction container for performing surface treatment on the treated member W housed therein. Note that, the chamber 20 is an example of a housing unit in the present disclosure.

The chamber 20 is formed of a rectangular parallelepiped shape, and has a shape in which a portion of one standing wall surface 20*a* of vertically-installed four standing wall surfaces is opened. On the other three standing wall surfaces of the chamber 20 (i.e., a standing wall surface 20*b*, a standing wall surface 20*c*, and a standing wall surface 20*d*), respective different surface treatment devices are installed. Specifically, a plasma production apparatus 21 is installed on the standing wall surface 20*b*. In addition, sputtering apparatuses 22 and 23 are respectively installed on the standing wall surface 20*c* and the standing wall surface 20*d*. Here, arrangement conditions of the plasma production apparatus 21, and the sputtering apparatuses 22 and 23 are not limited. In other words, the plasma production apparatus 21 and the sputtering apparatuses 22 and 23 may be arranged on whichever of the standing wall surfaces 20*b*, 20*c*, and 20*d*. Note that the plasma production apparatus 21 and the sputtering apparatuses 22 and 23 serve as an example of a surface treatment device in the present disclosure.

The sputtering apparatus 22 performs surface treatment of forming a thin film that serves as a primary coat in coating, on the treated member W by performing sputtering on the treated member W.

The plasma production apparatus 21 performs surface treatment of the treated member W by producing plasma by Hollow Cathode Discharge (HCD), and irradiating, with the produced plasma, the treated member W on which a thin film is formed by the sputtering apparatus 22, for example. More specifically, the plasma production apparatus 21 generates a functional group on the surface of the treated member W, for example. This improves adhesion of a thin film in generating a thin film that serves as a primary coat in coating, on the surface of the treated member W in a subsequent process.

The sputtering apparatus 23 performs surface treatment of further forming another a thin film on the surface having been subjected to surface treatment performed by the plasma production apparatus 21.

Note that, in the present embodiment, an example in which the respective different surface treatment devices are provided on the three standing wall surfaces 20*b*, 20*c*, and 20*d* will be described, but the number of surface treatment devices is not limited. In other words, only one surface treatment device may be provided. In addition, the types of surface treatment devices are not limited to the above-described types. In other words, a surface treatment device different from the above-described surface treatment devices may be provided.

The treated member placement portion 30 is a portion on which the treated member W is to be placed. A detailed structure of the treated member placement portion 30 will be described in detail below (refer to FIG. 2).

The treated member conveyance unit 40 is a conveyance mechanism that houses the treated member placement portion 30 having the treated member W placed thereon, into the chamber 20. In other words, the treated member conveyance unit 40 conveys the treated member placement portion 30 along an X-axis in FIG. 1. Note that the treated member conveyance unit 40 is an example of a conveyance device in the present disclosure. A detailed structure of the treated member conveyance unit 40 will be described in detail below (refer to FIG. 4).

On the back side of the chamber 20 (Y-axis negative direction side), the exhaust apparatus 50, the cooling apparatus 51, the control apparatus 52, the power supply apparatus 53, and the gas supply apparatus 54 are included.

The exhaust apparatus 50 brings the inside of the chamber 20 into a vacuum state by depressurizing the inside of the chamber 20. The exhaust apparatus 50 includes a rotary pump or a turbo-molecular pump, for example.

The cooling apparatus 51 generates cooling water for cooling apparatuses, a power source, and the like.

The control apparatus 52 performs control of the entire surface treatment apparatus 10.

The power supply apparatus 53 houses a power source for supplying power to each unit of the surface treatment apparatus 10.

The gas supply apparatus 54 supplies the chamber 20 with gas for film formation and gas for reaction.

In addition, the console panel 55 is included near the chamber 20. The console panel 55 receives an operation instruction to the surface treatment apparatus 10. In addition, the console panel 55 includes a function of displaying an operation state of the surface treatment apparatus 10.

2. Description of Configuration of Treated Member Placement Portion

Figure 2:
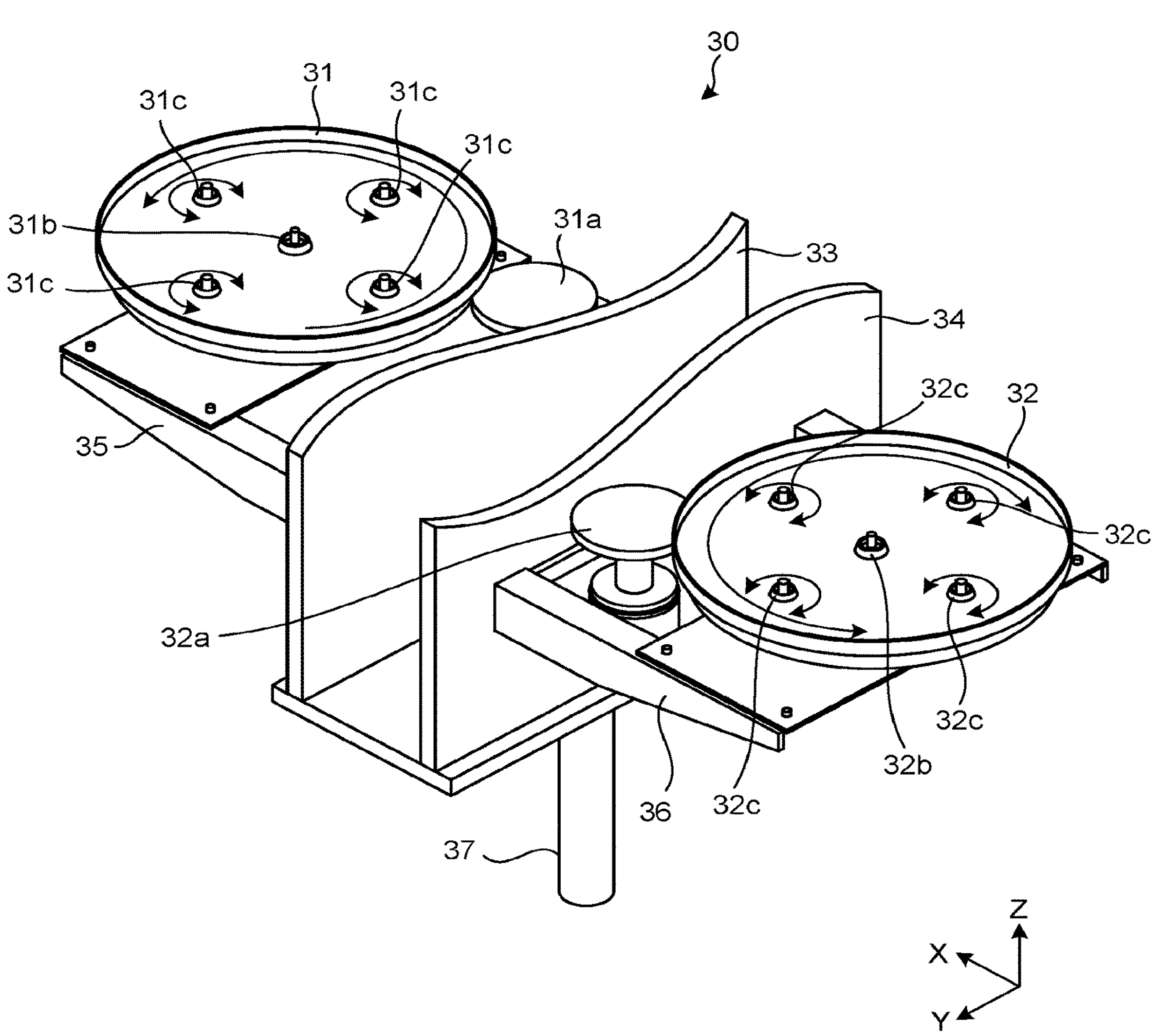
FIG. 2 is an external view of a treated member placement portion.

Next, the configuration of the treated member placement portion 30 will be described using FIG. 2. FIG. 2 is an external view of the treated member placement portion.

The treated member placement portion 30 includes two tables 31 and 32 on which the treated member W is to be placed. The table 31 is formed of a circular shape, and is installed above a floor surface member 35 extending along an X-Y plane, on the same plane as the X-Y plane. Then, the table 31 rotates around a table rotating shaft 31*b* extending along a Z-axis, by getting into contact with a lateral surface of a rotating plate 31*a* rotationally-driven by a servomotor (not illustrated). Note that the rotational direction of the table 31 is not limited. The table rotating shaft 31*b* is an example of a rotation device or a first rotation device in the present disclosure. In addition, each of the tables 31 and 32 is an example of a placement device in the present disclosure.

The floor surface member 35 is fixed in such a manner as to be orthogonal to a wall member 33 erected along a Y-Z plane. The wall member 33 makes the inside of the chamber 20 into an enclosed space by the wall member 33 hermetically sealing the standing wall surface 20*a* when the treated member placement portion 30 is moved toward the X-axis positive side and put into the chamber 20.

Similarly, the table 32 is formed of a circular shape, and is installed along the X-Y plane, above a floor surface member 36 extending along the X-Y plane. Then, the table 32 rotates around a table rotating shaft 32*b* extending along a Z-axis, by getting into contact with a lateral surface of a rotating plate 32*a* rotationally-driven by a servomotor (not illustrated). Note that the rotational direction of the table 32 is not limited. The table rotating shaft 32*b* is an example of a rotation device or a first rotation device in the present disclosure.

The floor surface member 36 is fixed in such a manner as to be orthogonal to a wall member 34 erected along the Y-Z plane.

A treated member placement portion rotating shaft 37 extending along the Z-axis is installed below the wall members 33 and 34. Being rotationally-driven by a servomotor (not illustrated), the treated member placement portion rotating shaft 37 rotates the entire treated member placement portion 30 around the Z-axis. Either one of the tables 31 and 32 is housed into the chamber 20. Note that the treated member placement portion rotating shaft 37 is an example of a selection device or a third rotation device in the present disclosure.

Note that, in a case where the table 32 is housed in the chamber 20, by the wall member 34 hermetically sealing the standing wall surface 20*a*, the inside of the chamber 20 is made into an enclosed space.

Note that attachment member rotating shafts 31*c* and 32*c* to be rotationally-driven by a servomotor (not illustrated) are respectively installed on the tables 31 and 32. The attachment member rotating shafts 31*c* and 32*c* are installed along the z-axis, and rotate an attachment member 38, (refer to FIG. 3) to be described later, having the treated member W attached thereto, around the Z-axis. Note that the rotational direction of the attachment member rotating shafts 31*c* and 32*c* is not limited. Note that each of the attachment member rotating shafts 31*c* and 32*c* is an example of a rotation device or a second rotation device in the present disclosure.

In the example illustrated in FIG. 2, the four attachment member rotating shafts 31*c* are installed around the table rotating shaft 31*b* and the four attachment member rotating shafts 32*c* are installed around the table rotating shaft 32*b*, at intervals of about 90°. Note that the numbers of the installed attachment member rotating shafts 31*c* and 32*c* are not limited.

3. Description of Configuration of Attachment Member

Figure 3:
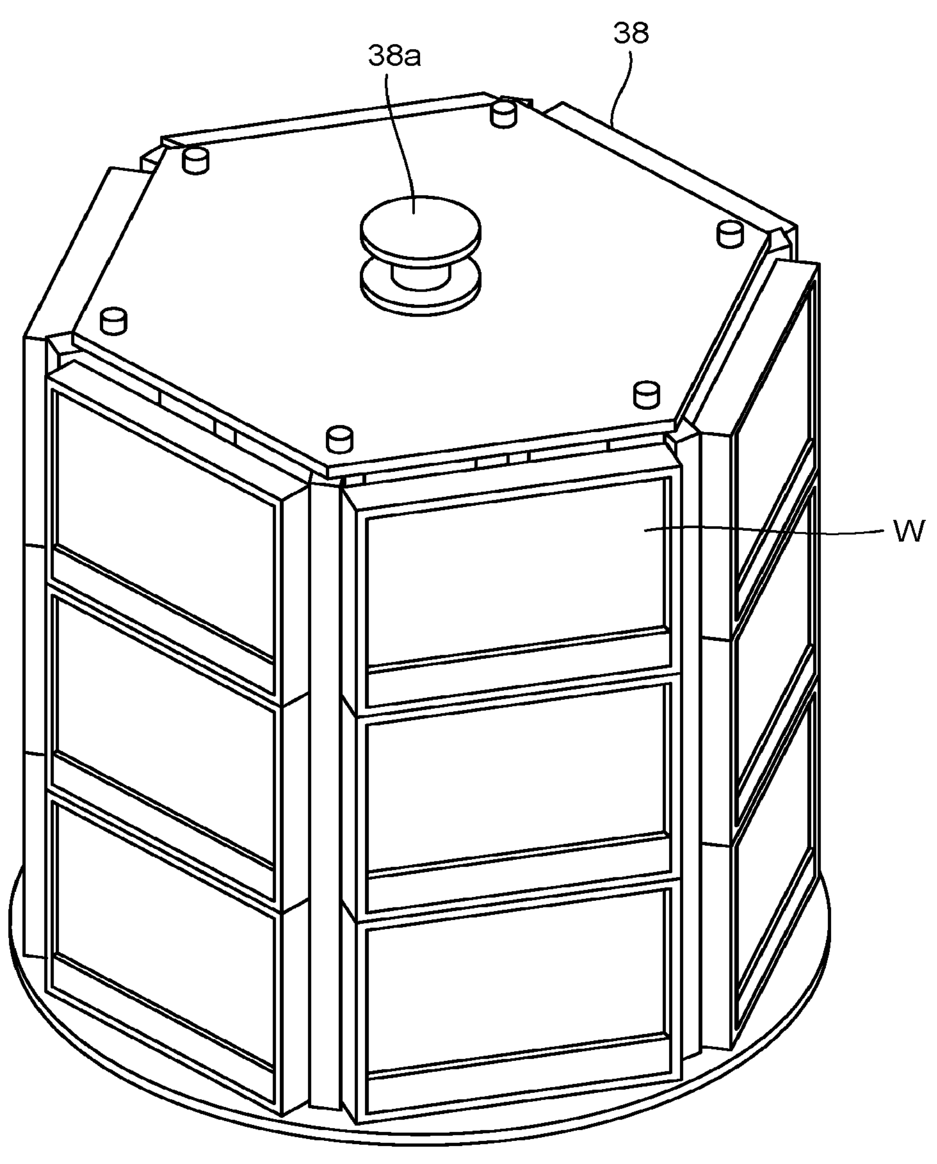
FIG. 3 is an external view of an attachment member to which a treated member is to be attached.

Next, a configuration of attaching the treated member W will be described using FIG. 3. FIG. 3 is an external view of the attachment member 38 to which a treated member is to be attached.

The attachment member 38 having the treated member W attached thereto is placed on the table 31 or 32. In the example illustrated in FIG. 3, the attachment member 38 is formed into a regular hexagonal prism, and three treated members W can be attached to each side surface. In other words, 18 treated members W can be attached to one attachment member 38.

The attachment member 38 is installed on the table 31 or 32 in such a manner that a central shaft 38*a* of the attachment member 38 coincides with the attachment member rotating shaft 31*c* or 32*c*. In other words, in the treated member placement portion 30 having the configuration illustrated in FIG. 2, up to 72 treated members W can be attached to each of the tables 31 and 32. Note that the shape of the attachment member 38 is not limited to the example illustrated in FIG. 3. The surface of the treated member W attached in this manner is subjected to surface treatment performed by the surface treatment apparatus 10.

Note that, while surface treatment is being performed, the attachment member 38 orbits around the table rotating shaft 31*b* (or table rotating shaft 32*b*) of the table 31 (or table 32) while the attachment member 38 rotating around the central shaft 38*a* (attachment member rotating shaft 31*c*). With this configuration, the surface of the treated member W faces (becomes parallel to, opposed to) the plasma production apparatus 21, or the sputtering apparatus 22 or 23 every predetermined time. Thus, the surface is uniformly treated. Note that, because a rotating speed, an orbital speed, a rotating direction, and an orbital direction of the attachment member 38 can be arbitrarily set based on a predetermined rotation pattern, the rotating speed, the orbital speed, the rotating direction, and the orbital direction are appropriately set depending on the type of surface treatment to be executed, the type of the treated member W, and the like. For example, the treated member W may be caused to rotate or orbit at a fixed rotating speed. In addition, the rotation and the orbit of the treated member W may be stopped for a predetermined time period, when the treated member W faces a surface treatment device. In addition, the treated member W may be caused to only rotate, or only orbit.

Note that the configuration of the attachment member 38 is not limited to the example illustrated in FIG. 3. For example, the attachment member 38 may be a plate-like member. A plurality of treated members W may be respectively attached to both sides of the plate-like member, and the plate-like member may be rotated around the table rotating shaft 31*b* (31*c*) while the central shaft 38*a* provided on the plate-like member, being rotated around the attachment member rotating shaft 31*c* (32*c*). In addition, the rotation of the attachment member rotating shaft 31*c* (32*c*) may be stopped, and the attachment member 38 may be rotated only around the table rotating shaft 31*b* (31*c*). In addition, the treated member W may be directly placed on the table 31 (32).

4. Description of Configuration of Treated Member Conveyance Unit

Figure 4:
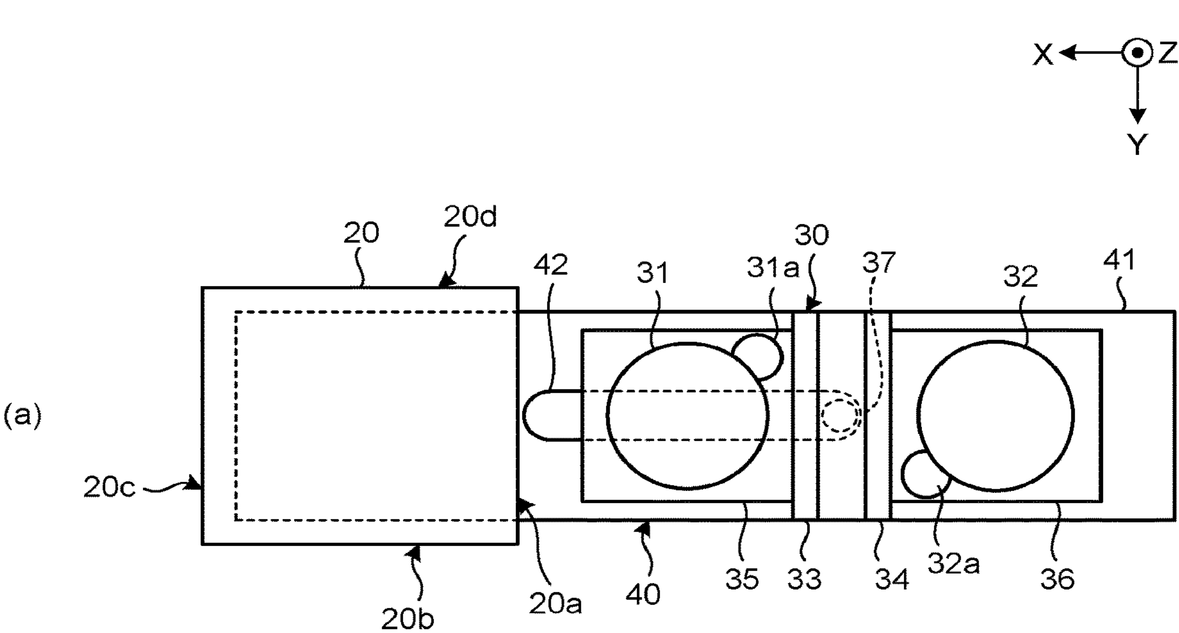
FIG. 4 is a diagram explaining a function of a treated member conveyance unit.
Figure 4:
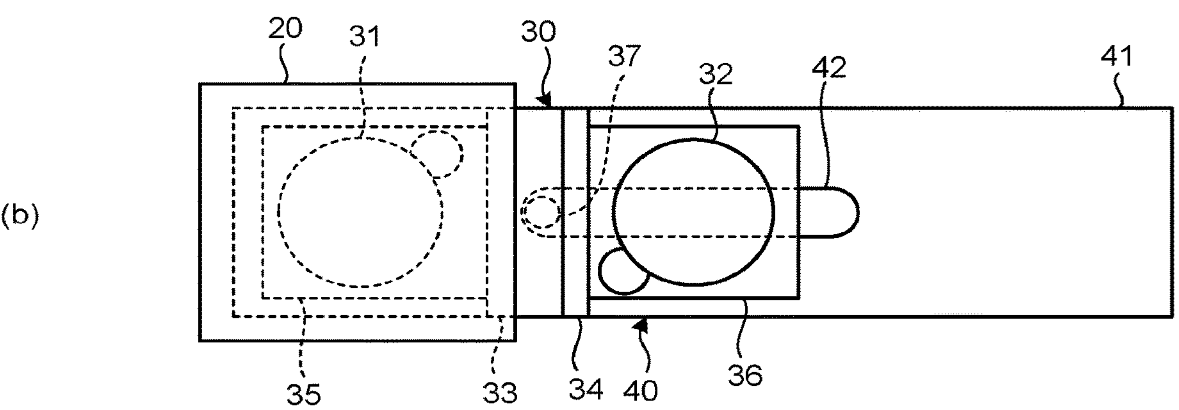
Figure 4:
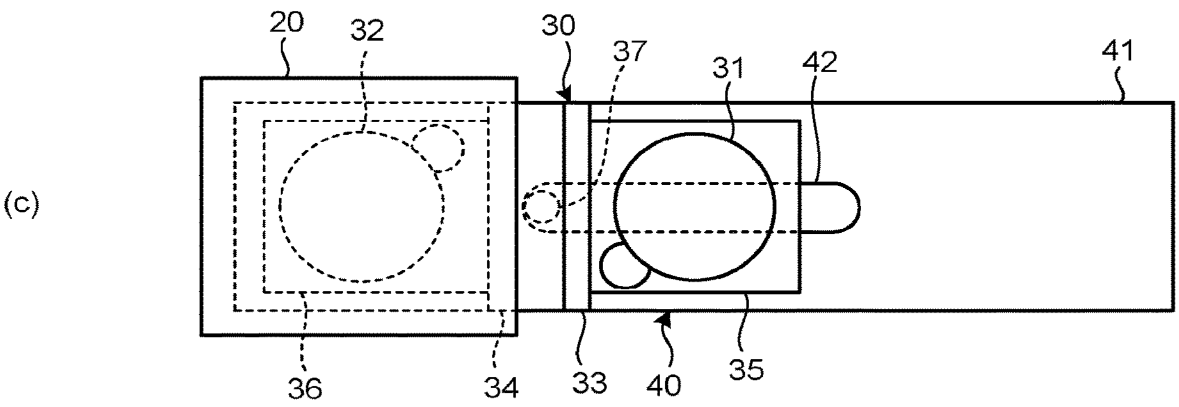

Next, the configuration of the treated member conveyance unit 40 will be described using FIG. 4. FIG. 4 is a diagram explaining a function of the treated member conveyance unit.

As illustrated at (a) in FIG. 4, the treated member conveyance unit 40 includes a support platform 41 and a groove portion 42. The support platform 41 supports the treated member placement portion 30. The groove portion 42 is a hollow through which the treated member placement portion rotating shaft 37 passes, when the treated member placement portion 30 is conveyed along the X-axis.

FIG. 4 illustrates, at (b), a state in which the table 31 is housed into the chamber 20 by the treated member conveyance unit 40 conveying the treated member placement portion 30 in an X-axis positive direction when the treated member placement portion 30 is in the state illustrated at (a) in FIG. 4. At this time, as illustrated at (b) in FIG. 4, the table 31, the rotating plate 31*a*, and the floor surface member 35 are housed in the chamber 20. Then, the standing wall surface 20*a* of the chamber 20 is hermetically-sealed by the wall member 33.

FIG. 4 illustrating, at (c), a state in which the table 32 is housed into the chamber 20 by the treated member conveyance unit 40 conveying the treated member placement portion 30 in the X-axis positive direction after rotating the treated member placement portion rotating shaft 37 by 180° when the treated member placement portion 30 is in the state illustrated at (a) in FIG. 4. At this time, as illustrated at (c) in FIG. 4, the table 32, the rotating plate 32*a*, and the floor surface member 36 are housed into the chamber 20. Then, the standing wall surface 20*a* of the chamber 20 is hermetically-sealed by the wall member 34.

Note that, when the treated member placement portion 30 is in the state illustrated at (b) in FIG. 4, the surface treatment apparatus 10 performs surface treatment on the treated member W placed on the table 31. At this time, an operator attaches the treated member W to be subjected to surface treatment next, to the attachment member 38, and places the attachment member 38 to which the treated member W is attached, on the table 32.

In addition, when the treated member placement portion 30 is in the state illustrated at (c) in FIG. 4, the surface treatment apparatus 10 performs surface treatment on the treated member W placed on the table 32. At this time, the operator removes the treated member W of which surface treatment has ended, from the attachment member 38 placed on the table 31.

5. Description of Internal Structure of Chamber

Figure 5:
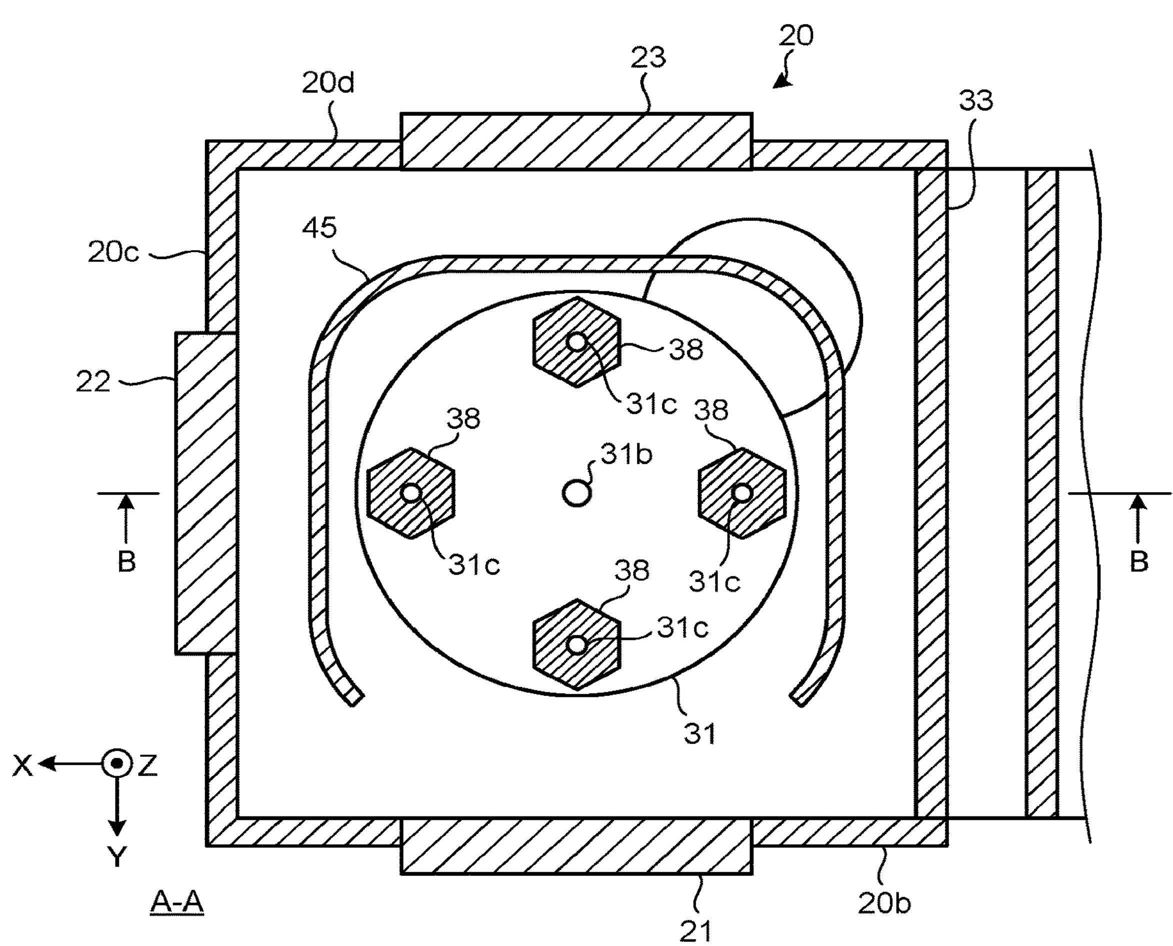
FIG. 5 is a diagram illustrating an example of an internal structure of a chamber.
Figure 5:
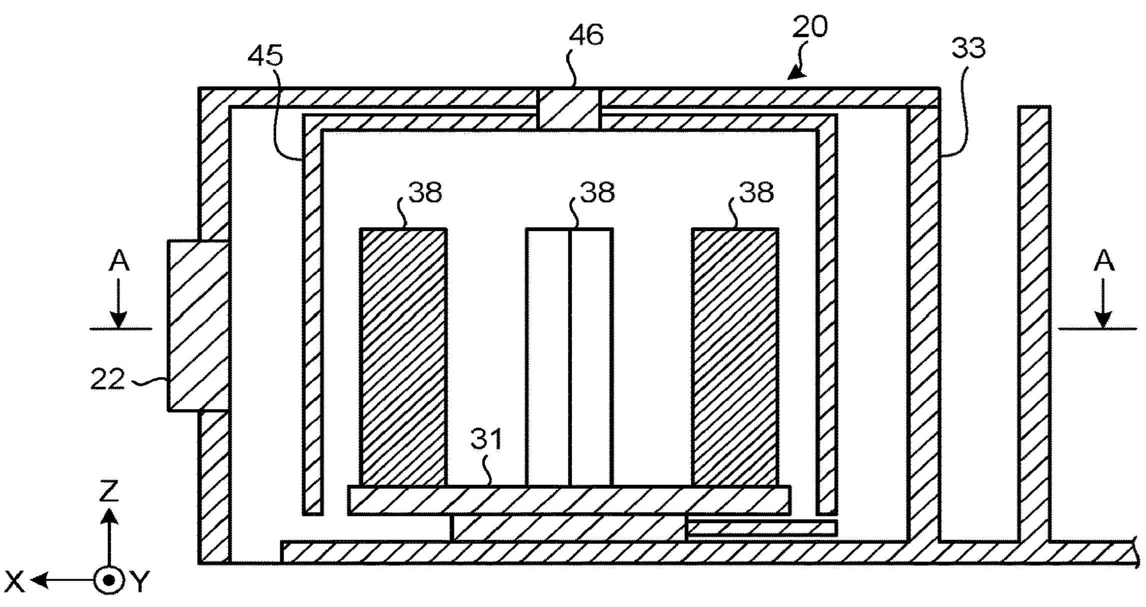

Next, an internal structure of the chamber 20 will be described using FIG. 5. FIG. 5 is a diagram illustrating an internal structure of the chamber 20.

A shutter 45 is installed inside the chamber 20. The shutter 45 is formed of a C-shape in which only a side facing one surface of the standing wall surfaces of the chamber 20 is made into an opening portion, and is rotationally-driven by a servomotor 46 installed on the top surface of the chamber 20. Note that the shutter 45 is installed in such a manner as not to interfere with the rotation of the table 31 (32) and the attachment member 38. With this configuration, the shutter 45 shields electrode planes of apparatuses other than an operating apparatus, among the plasma production apparatus 21, and the sputtering apparatuses 22 and 23 that perform surface treatment of the treated member W. In addition, when the table 31 (32) is put into or taken out from the chamber 20, the opening portion of the shutter 45 is turned toward the direction of the standing wall surface 20*a*.

When one of a plurality of surface treatment devices performs surface treatment on the treated member W, the shutter 45 shields a surface of another surface treatment device than the surface treatment device. Note that the shutter 45 is an example of a shielding member in the present disclosure.

Note that the configuration of the shutter 45 is not limited to the configuration illustrated in FIG. 5. For example, a structure in which a plurality of elongated plate-like members are installed like louvers over the wall surfaces of the standing wall surfaces 20*b*, 20*c*, and 20*d*, and only an electrode plane on which surface treatment is to be performed is exposed by pulling these plate-like members upward may be employed.

6. Description of Configuration of Plasma Production Apparatus

Figure 6:
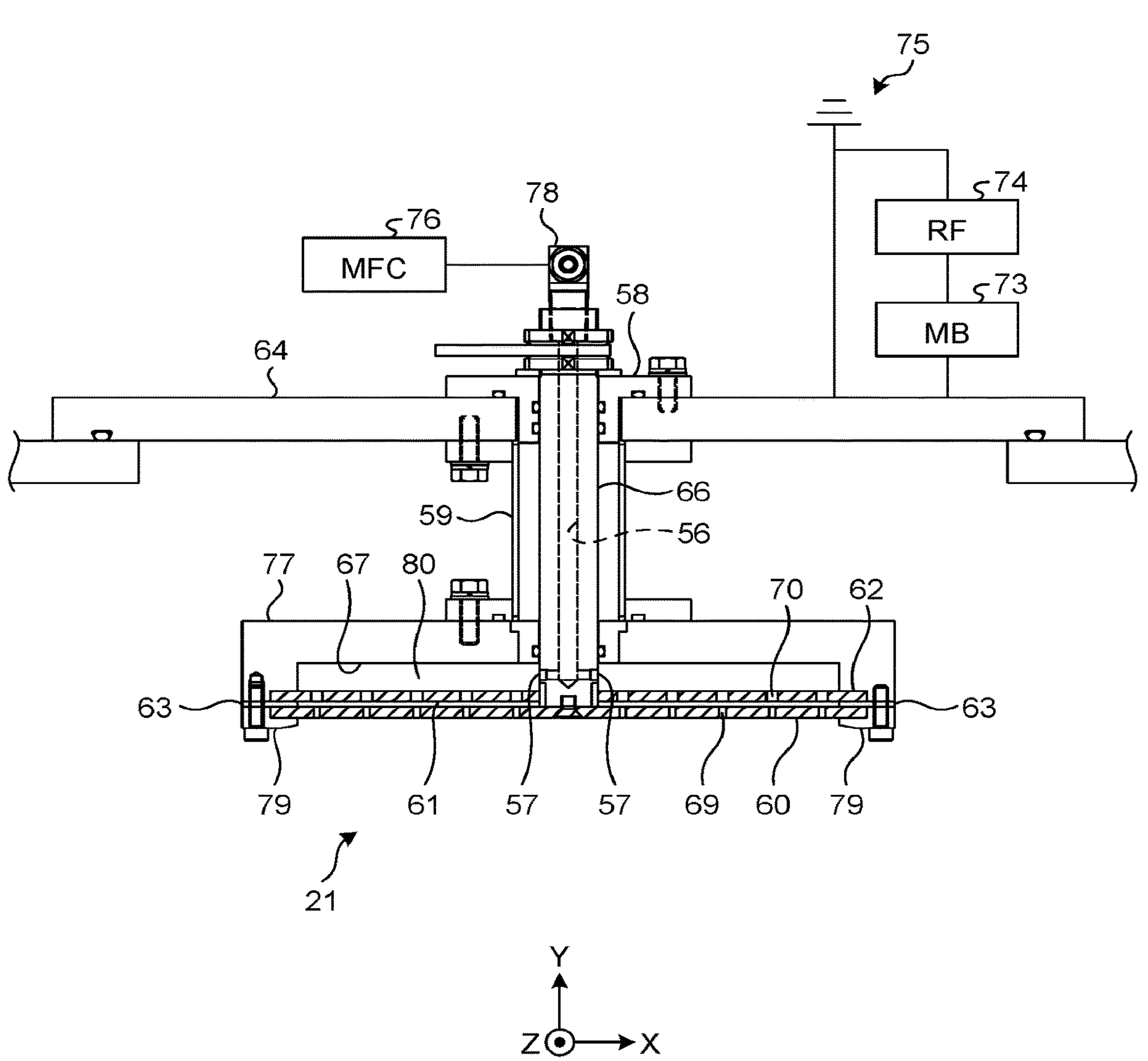
FIG. 6 is a diagram illustrating an example of a configuration of a plasma production apparatus.

Next, the configuration of the plasma production apparatus 21 will be described using FIG. 6. FIG. 6 is a diagram illustrating an example of a configuration of the plasma production apparatus.

The plasma production apparatus 21 includes a gas supply line 66 that supplies gas such as argon to be used when plasma is produced, and a pair of plate-like conductive portions 60 and 62 that produce plasma by high-frequency voltage using gas supplied from the gas supply line 66.

The gas supply line 66 penetrates through a support plate 64 in a thickness direction of the support plate 64, and is attached to the support plate 64 by a gas supply line attachment member 58. In addition, a gas flow path 56 extending along an extending direction of the gas supply line 66 is formed inside the gas supply line 66, and gas is supplied via the gas flow path 56 from the outside of the chamber 20 to the inside of the chamber 20. Note that a gas supply portion 78 that supplies gas to the gas supply line 66 is connected to an end of the gas supply line 66 on an external side of the support plate 64 (external side of the chamber 20), and a gas supply hole 57 being a hole through which gas that has flowed on the gas flow path 56 is introduced into the chamber 20 is formed at an end of the gas supply line 66 on another end side (internal side of the chamber 20). A gas is supplied to the gas supply portion 78 via a mass flow controller (MFC) 76 obtained by causing a mass flowmeter to have a function of flow rate control.

The pair of plate-like conductive portions 60 and 62 are both formed into a plate-like shape, and formed by arranging metal plates such as aluminum or other conductor plates in parallel. The plate-like conductive portions 60 and 62 are supported by a support plate 77. The support plate 77 is formed by insulating material such as glass or ceramic, for example. The support plate 77 is formed into a shape in which a protruding portion is formed over the entire perimeter near an outer periphery on one surface side of a plate. In other words, the support plate 77 is formed into a plate-like shape in which a recess portion 67 recessed along an outer periphery of the support plate 77 is formed on one surface side.

The support plate 77 is arranged in a direction in which a surface on the side on which the recess portion 67 is not formed faces the support plate 64, and a surface on the side on which the recess portion 67 is formed is positioned on the opposite side of the side on which the support plate 64 is positioned, and is supported by a supporting member 59. The supporting member 59 includes a cylindrical member and attachment members positioned at both ends of the cylindrical member, and the attachment member on one end side is attached to the support plate 64 and the attachment member on another end side is attached to the support plate 77.

The gas supply line 66 penetrating through the support plate 64 extends up to the position of the support plate 77 through the inside of the cylindrical member in the supporting member 59, and penetrates through the support plate 77. Then, the gas supply hole 57 formed on the gas supply line 66 is arranged at a portion of the support plate 77 in which the recess portion 67 is formed.

The pair of plate-like conductive portions 60 and 62 are arranged over the recess portion 67 on the side on which the recess portion 67 is formed in the support plate 77. At this time, a spacer 63 is arranged near an outer perimeter between the pair of plate-like conductive portions 60 and 62, and the pair of plate-like conductive portions 60 and 62 are overlaid via the spacer 63. In a portion other than the spacer 63 in the pair of plate-like conductive portions 60 and 62 overlaid via the spacer 63, the plate-like conductive portion 60 and the plate-like conductive portion 62 are separated from each other, and a void portion 61 is formed. It is desirable to appropriately set an interval of the void portion 61 depending on gas to be introduced in the plasma production apparatus 21, frequency of power to be supplied, and furthermore, the size of an electrode, and the like, and the interval is about 3 mm to 12 mm, for example.

The pair of plate-like conductive portions 60 and 62 overlaid via the spacer 63 are held by a holding member 79 being a member for holding the plate-like conductive portions 60 and 62. More specifically, the holding member 79 is arranged on an opposite side of the side of the plate-like conductive portions 60 and 62 on which the support plate 77 is positioned, and the holding member 79 is attached to the support plate 77 in a state in which the plate-like conductive portions 60 and 62 are sandwiched by the holding member 79 and the support plate 77.

The pair of plate-like conductive portions 60 and 62 are arranged over the recess portion 67 in the support plate 77 in this manner, and in a state in which the pair of plate-like conductive portions 60 and 62 are held by the holding member 79, a space is formed between the recess portion 67 of the support plate 77 and the plate-like conductive portions 60 and 62.

In a case where the plate-like conductive portion 62 is arranged on the support plate 77 side and the plate-like conductive portion 60 is arranged on the holding member 79 side, out of the pair of plate-like conductive portions 60 and 62 arranged in an overlaid manner, this space is compartmented by the recess portion 67 of the support plate 77 and the plate-like conductive portion 62. The space formed in this manner is formed as a gas introduction portion 80 to which gas is supplied by the gas supply line 66. The gas supply hole 57 of the gas supply line 66 is positioned in the gas introduction portion 80, and opened toward the gas introduction portion 80. The gas introduction portion 80 is compartmented by the support plate 77 and the plate-like conductive portion 62 being closely-attached.

In addition, a number of through-holes 69 and 70 penetrating in the thickness direction are formed in the pair of plate-like conductive portions 60 and 62. More specifically, a plurality of through-holes 70 is formed in a matrix at predetermined intervals in the case of being viewed in the thickness direction of the plate-like conductive portion 62, in the plate-like conductive portion 62 positioned on an inflow side of gas supplied by the gas supply line 66, and a plurality of through-holes 69 is formed in a matrix at predetermined intervals in the case of being viewed in the thickness direction of the plate-like conductive portion 60, in the plate-like conductive portion 60 positioned on an outflow side of gas supplied by the gas supply line 66.

The through-holes 69 of the plate-like conductive portion 60 and the through-holes 70 of the plate-like conductive portion 62 are cylindrically-shaped holes, and the corresponding through-holes 69 and 70 of the both plate-like conductive portions are coaxially arranged. In other words, the through-hole 69 of the plate-like conductive portion 60 and the through-hole 70 of the plate-like conductive portion 62 are arranged at positions at which the respective centers of the through-holes are uniform. Among the through-holes, the through-holes 69 of the plate-like conductive portion 60 have a diameter smaller than that of the through-holes 70 of the plate-like conductive portion 62 on the gas inflow side. In this manner, a hollow electrode structure is formed by a plurality of through-holes 69 and 70 being formed in the pair of plate-like conductive portions 60 and 62, and produced plasma gas flows via the plurality of through-holes 69 and 70.

The void portion 61 is interposed between the plate-like conductive portions 60 and 62 of a parallel plate type, and the void portion 61 functions as a capacitor having capacitance. Then, in the support plate 77 and the plate-like conductive portions 60 and 62, conductive portions (not illustrated in the drawing) are formed by conductive members, and by the conductive portions, the support plate 77 is grounded 75 and the plate-like conductive portion 62 is grounded 75. In addition, one end of a high-frequency power source (RF) 74 is grounded 75 and another end of the high-frequency power source 74 is electrically-connected with the plate-like conductive portion 60 via a matching box (MB) 73 for obtaining consistency with plasma by adjusting capacitance or the like. Accordingly, in a case where the high-frequency power source 74 is operated, the potential of the plate-like conductive portion 60 fluctuates to plus and minus at a predetermined frequency such as 13.56 MHz, for example.

Then, surface treatment such as film formation and cleaning of the treated member W in the chamber 20 is performed using plasma gas flowing out from the through-holes 70.

7. Description of Configuration of Sputtering Apparatus

Figure 7:
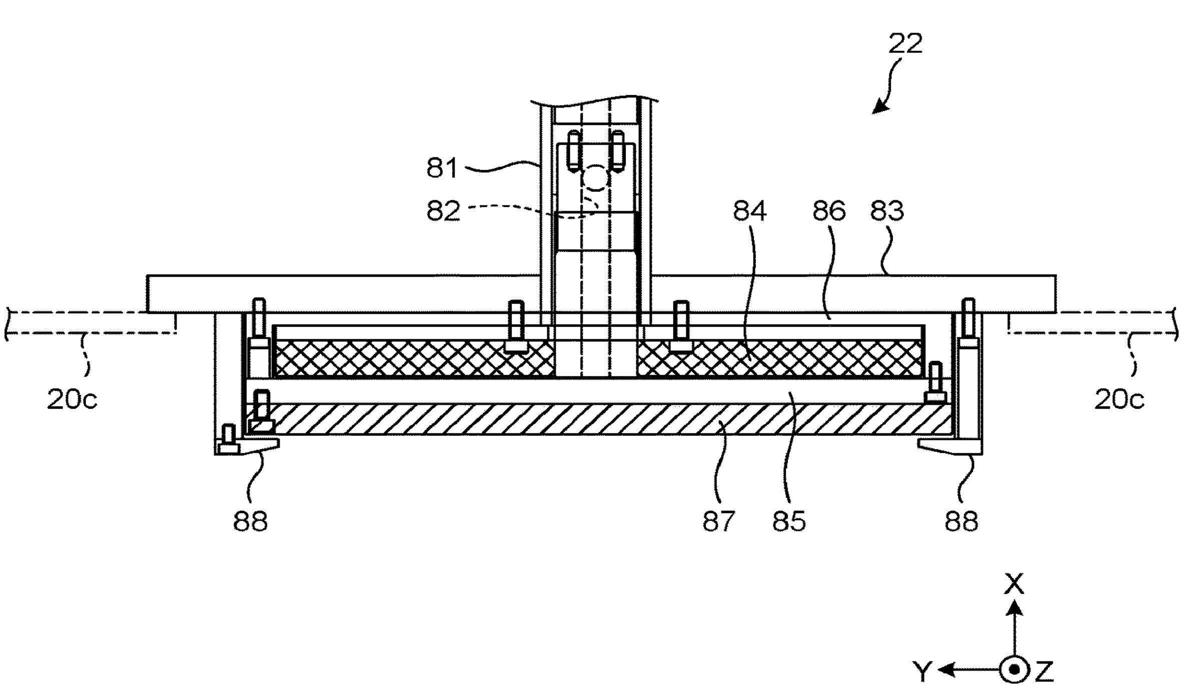
FIG. 7 is a diagram illustrating an example of a configuration of a sputtering apparatus.

Next, the configuration of the sputtering apparatus 22 will be described using FIG. 7. FIG. 7 is a diagram illustrating an example of a configuration of the sputtering apparatus. Note that, because the sputtering apparatus 23 has the same configuration as the sputtering apparatus 22, here, only the sputtering apparatus 22 will be described.

The sputtering apparatus 22 includes a cooling water pipe 81 through which cooling water flows, a magnet 84 that generates a magnetic field, a target 87 that sputters atoms to be used in film formation, by ionizing inactive gas (e.g., argon) supplied from the gas supply apparatus 54 (refer to FIG. 1) and flowed in from a gas inflow portion (not illustrated), and causing collision inside the magnetic field generated by the magnet 84, a cooling jacket 85 that cools the target 87, and a support plate 83 that supports the magnet 84, the target 87, and the cooling jacket 85. The cooling water pipe 81 penetrates through the support plate 83. Note that the target 87 is a copper plate, for example, and a copper thin film is formed on the surface of the treated member W by copper atom sputtered from the target 87, adhering tightly to the surface of the treated member W.

A cooling water channel 82 extending along an extending direction of the cooling water pipe 81 is formed inside the cooling water pipe 81. Note that the cooling water channel 82 includes a water channel (not illustrated in FIG. 7) that supplies cooling water for cooling, to the cooling jacket 85 from the outside of the chamber 20, and a water channel (not illustrated in FIG. 7) that discharges cooling water that has been used in cooling, from the cooling jacket 85 to the outside of the chamber 20. In this manner, the cooling water pipe 81 causes cooling water to circulate between the outside of the chamber 20 and the cooling jacket 85 arranged inside the chamber 20. Note that an inflow path (not illustrated in FIG. 7) and a discharge path (not illustrated in FIG. 7) of cooling water are connected to an end of the cooling water pipe 81 on the outside of the chamber 20. On the other hand, an end of the cooling water pipe 81 on another end side (inside of the chamber 20) is connected to the cooling jacket 85. A flow path of cooling water is formed inside the cooling jacket 85, and cooling water flows thereinside. With this configuration, cooling water circulates between the outside of the chamber 20 and the cooling jacket 85. Note that cooling water is supplied from the cooling apparatus 51 (refer to FIG. 1) described above.

The support plate 83 supports the magnet 84, the cooling jacket 85, and the target 87 in a state in which they are overlaid. More specifically, the support plate 83, the magnet 84, the cooling jacket 85, and the target 87 are all formed into plate-like shapes, and are formed into shapes in which a shape of the support plate 83 in a planar view is larger than those of the magnet 84, the cooling jacket 85, and the target 87. Thus, the magnet 84, the cooling jacket 85, and the target 87 are held by the support plate 83 and a holding member 88 by an outer perimeter vicinity of a surface of the target 87 on an opposite side of a surface on the cooling jacket 85 side being supported by the holding member 88 in a state in which the magnet 84, the cooling jacket 85, and the target 87 are overlaid in this order from the support plate 83 side. In addition, the magnet 84, the cooling jacket 85, and the target 87 that are held by the holding member 88 are held in a state in which an outer perimeter portion thereof is also surrounded by the holding member 88.

At this time, an insulating member 86 is arranged between the support plate 83 and the magnet 84, and the insulating member 86 is arranged also in an outer perimeter portion in a planar view of the magnet 84. In other words, the insulating member 86 is arranged between the support plate 83 and the magnet 84, and between the magnet 84 and the holding member 88. Thus, the magnet 84 is held by the support plate 83 and the holding member 88 via the insulating member 86.

The sputtering apparatus 22 performs so-called sputtering of forming a thin film on the surface of the treated member W. When the sputtering apparatus 22 performs sputtering, after the inside of the chamber 20 is depressurized by the exhaust apparatus 50 (refer to FIG. 1), gas to be used in sputtering flows from the gas supply apparatus 54 (refer to FIG. 1) into the chamber 20. Then, by the magnetic field generated by the magnet 84 of the sputtering apparatus 22, gas in the chamber 20 is ionized, and ions are caused to collide with the target 87. With this configuration, atoms of the target 87 is sputtered from the surface of the target 87.

For example, in a case where aluminum is used in the target 87, when ions of gas ionized near the target 87 collide with the target 87, the target 87 sputters atoms of aluminum. Aluminum atoms sputtered from the target 87 head for an X-axis negative direction. Because the treated member W is positioned at a position in the chamber 20 that faces the surface of the target 87, aluminum atoms sputtered from the target 87 move toward the treated member W and adhere tightly to the treated member W, and are accumulated on the surface of the treated member W. With this configuration, a thin film corresponding to the material forming the target 87 is formed on the surface of the treated member W.

8. Description of Specific Surface Treatment

Figure 8:
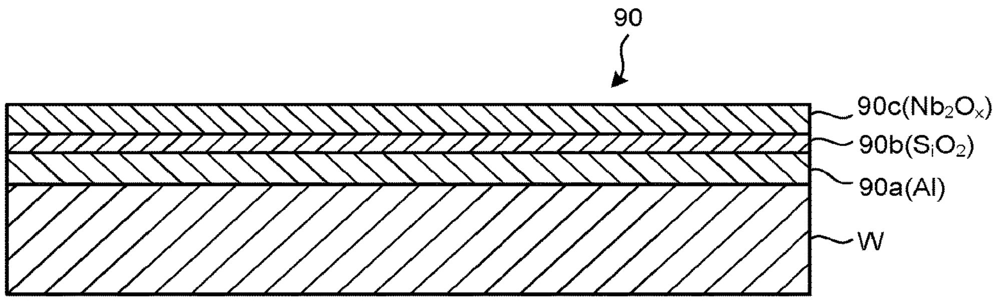
FIG. 8 is a diagram illustrating an example of surface treatment to be performed by a surface treatment apparatus on a treated member.
Figure 9:
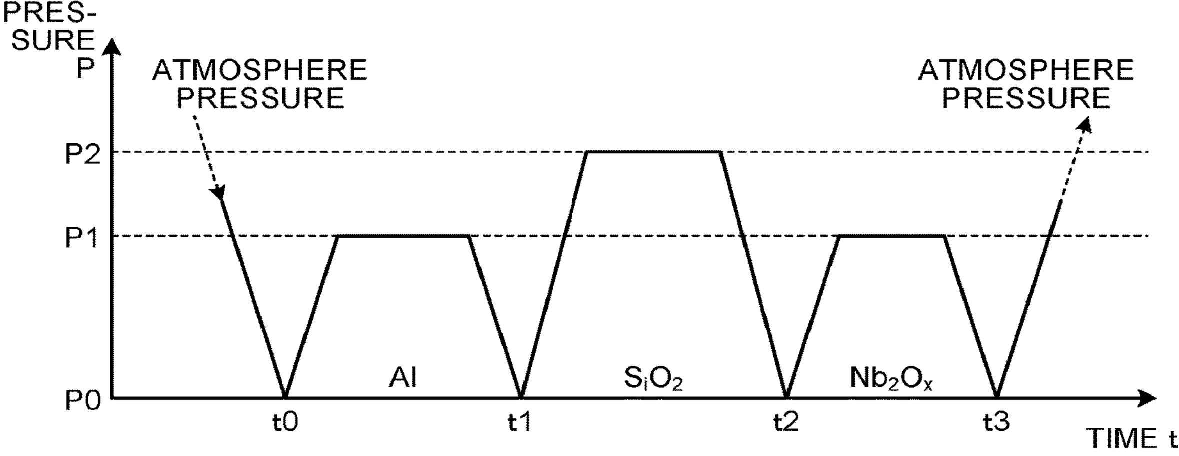
FIG. 9 is a diagram illustrating an example of a pressure change inside a chamber that is caused when a surface treatment apparatus performs surface treatment on a treated member.

Next, a specific example of surface treatment to be performed by the surface treatment apparatus 10 of the present embodiment will be described using FIGS. 8 and 9. FIG. 8 is a diagram illustrating an example of surface treatment to be performed by a surface treatment apparatus on a treated member. FIG. 9 is a diagram illustrating an example of a pressure change inside a chamber that is caused when a surface treatment apparatus performs surface treatment on a treated member.

In the present embodiment, the surface treatment apparatus 10 generates a mirror 90, which is an example of an optical component, for example, on one surface of the treated member W. The mirror 90 has substantially constant reflectance over the entire range of a visible light range (400 to 800 nm).

First of all, the surface treatment apparatus 10 generates an Al layer 90*a* being a thin film of aluminum (Al), on the surface of the treated member W by operating the sputtering apparatus 22. At this time, sputtering of aluminum is performed in a state in which the inside of the chamber 20 is pressurized to a pressure P1 by flowing gas, from a state in which the inside of the chamber 20 is depressurized to a pressure P0 (for example, from $10^{-2}$ to $10^{-3}$ Pa) at a time t0 as illustrated in FIG. 9. The pressure P1 is 20 Pa, for example. After the completion of sputtering, the inside of the chamber 20 is depressurized again to the pressure P0 at a time t1. At this time, aluminum is used in the target 87. Note that, in FIG. 9, a vertical axis indicates a pressure P, and a lower side indicates a more depressurized state.

While sputtering is being performed, the surface treatment apparatus 10 generates the uniform Al layer 90*a* on the surface of the treated member W by causing the attachment member 38 to orbit while rotating, using the table 31 (or table 32). Note that a rotating speed, an orbital speed, a rotating direction, and an orbital direction are not limited, and are set depending on a generation condition of the Al layer 90*a* or the like.

Next, by operating the plasma production apparatus 21, the surface treatment apparatus 10 generates a $SiO_2$ layer 90*b* on the surface of the Al layer 90*a* of the treated member W. At this time, the $SiO_2$ layer 90*b* (polymerized film) is generated in a state in which the chamber 20 is pressurized to a pressure P2 by flowing gas, from a state in which the inside of the chamber 20 is depressurized to the pressure P0 at the time t1. Note that the pressure P2 is set to a pressure higher than the pressure P1. The pressure P2 is 30 Pa, for example. After the generation of the $SiO_2$ layer 90*b*, the inside of the chamber 20 is depressurized again to the pressure P0 at a time t2.

While the generation of the $SiO_2$ layer 90*b* is being performed, the surface treatment apparatus 10 generates the uniform $SiO_2$ layer 90*b* on the surface of the treated member W by causing the attachment member 38 to orbit while rotating, using the table 31 (or table 32). A rotating speed, an orbital speed, a rotating direction, and an orbital direction for the treated member W are not limited, and are set depending on a generation condition of the $SiO_2$ layer 90*b* or the like. Note that, for example, water vapor and silane-series gas flow as film formation gas into the chamber 20 to generate the $SiO_2$ layer 90*b*.

Next, by operating the sputtering apparatus 23, the surface treatment apparatus 10 generates a $Nb_2O_x$ layer 90*c* being a thin film of niobium oxide ($Nb_2O_x$), on the surface of the $SiO_2$ layer 90*b* of the treated member W. At this time, sputtering of $Nb_2O_x$ is performs in a state in which the inside of the chamber 20 is pressurized to the pressure P1 by flowing gas, from a state in which the chamber 20 is depressurized to the pressure P0 at the time t2. At this time, niobium oxide is used in the target 87. Then, after the completion of sputtering, the inside of the chamber 20 is depressurized again to the pressure P0 at a time t3.

While sputtering is being performed, the surface treatment apparatus 10 generates the uniform $Nb_2O_x$ layer 90*c* on the surface of the treated member W by causing the table 31 (or table 32) to orbit, while causing the attachment member 38 to rotate. Note that a rotating speed, an orbital speed, a rotating direction, and an orbital direction are not limited, and are set depending on a generation condition of the $Nb_2O_x$ layer 90*c* or the like.

Note that, before the start of surface treatment of the treated member W and after the completion of the surface treatment, the chamber 20 is opened and a pressure inside the chamber 20 becomes equal to atmosphere pressure.

Note that the order of the Al layer 90*a*, the $SiO_2$ layer 90*b*, and the $Nb_2O_x$ layer 90*c* that are generated by the surface treatment apparatus 10 is not limited to the above-described example. In other words, after the $SiO_2$ layer 90*b* is generated on the surface of the treated member W, the Al layer 90*a* may be generated on the surface of the $SiO_2$ layer 90*b*, and the $Nb_2O_x$ layer 90*c* may be generated on the surface of the Al layer 90*a*. In addition, after the Al layer 90*a*, the $SiO_2$ layer 90*b*, and the $Nb_2O_x$ layer 90*c* are generated, the $SiO_2$ layer 90*b* and the $Nb_2O_x$ layer 90*c* may be further generated on the $Nb_2O_x$ layer 90*c*.

9. Description of Flow of Processing to be Performed by Surface Treatment Apparatus Next, a flow of processing to be performed by the surface treatment apparatus 10 will be described using FIG. 10. FIG. 10 is a flowchart illustrating an example of a flow of processing to be performed when a surface treatment apparatus performs surface treatment on a treated member.

First of all, the attachment member 38 to which the treated member W is attached is placed on the table 31 (Step S11).

The treated member conveyance unit 40 houses the table 31 into the chamber 20 (Step S12). Note that, at this time, an opening portion of the shutter 45 is turned toward a direction of the opened standing wall surface 20*a*. After the completion of Step S12, while the surface treatment apparatus 10 performs surface treatment, the attachment member 38 to which the treated member W on which surface treatment is to be performed next is attached may be placed on the table 32 existing on the outside of the chamber 20.

In accordance with an instruction of the console panel 55, the servomotor 46 is rotated, and an opening portion of the shutter 45 is turned to face the direction toward the standing wall surface 20*c* (i.e., direction toward the sputtering apparatus 22) (Step S13).

The exhaust apparatus 50 depressurizes the inside of the chamber 20 up to the pressure P0 (Step S14).

The gas supply apparatus 54 supplies gas into the chamber and pressurizes the inside of the chamber 20 up to the pressure P1 (Step S15).

In accordance with an instruction of the console panel 55, the table 31 and the attachment member 38 are rotated (Step S16).

The sputtering apparatus 22 generates the Al layer 90*a* on the surface of the treated member W (Step S17).

In accordance with an instruction of the console panel 55, the rotation of the table 31 and the attachment member 38 is stopped (Step S18).

The exhaust apparatus 50 depressurizes the inside of the chamber 20 up to the pressure P0 (Step S19).

In accordance with an instruction of the console panel 55, the servomotor 46 is rotated, and an opening portion of the shutter 45 is turned toward the direction of the standing wall surface 20*b* (i.e., direction of the plasma production apparatus 21) (Step S20).

The gas supply apparatus 54 supplies gas into the chamber and pressurizes the inside of the chamber 20 up to the pressure P2 (Step S21).

In accordance with an instruction of the console panel 55, the table 31 and the attachment member 38 are rotated (Step S22).

The plasma production apparatus 21 generates the $SiO_2$ layer 90*b* on the surface of the Al layer 90*a* (Step S23).

In accordance with an instruction of the console panel 55, the rotation of the table 31 and the attachment member 38 is stopped (Step S24).

The exhaust apparatus 50 depressurizes the inside of the chamber 20 up to the pressure P0 (Step S25).

In accordance with an instruction of the console panel 55, the servomotor 46 is rotated, and an opening portion of the shutter 45 is turned toward the direction of the standing wall surface 20*c* (i.e., direction of the sputtering apparatus 23) (Step S26).

The gas supply apparatus 54 supplies gas into the chamber and pressurizes the inside of the chamber 20 up to the pressure P1 (Step S27).

In accordance with an instruction of the console panel 55, the table 31 and the attachment member 38 are rotated (Step S28).

The sputtering apparatus 23 generates the $Nb_2O_x$ layer 90*c* on the surface of the $SiO_2$ layer 90*b* (Step S29).

In accordance with an instruction of the console panel 55, the rotation of the table 31 and the attachment member 38 is stopped (Step S30).

The exhaust apparatus 50 depressurizes the inside of the chamber 20 up to the pressure P0 (Step S31).

In accordance with an instruction of the console panel 55, by stopping the exhaust apparatus 50 and opening a pressure regulation valve (not illustrated), surrounding atmosphere of the chamber 20 is taken into the chamber 20, and the inside of the chamber is opened to the atmosphere (Step S32).

The treated member conveyance unit 40 takes out the table 31 from the chamber 20 (Step S33).

The treated member W of which surface treatment has been completed is taken out from the attachment member 38 (Step S34).

Note that, after that, each process described above may be repeated by rotating the treated member placement portion rotating shaft 37 and turning the table 32 to the direction of the chamber 20, which is not illustrated in the flowchart in FIG. 10.

In addition, a series of processes described above may be executed based on an instruction of an operator, or may be automatically executed in accordance with a preliminarily-created sequence.

As described above, in the surface treatment apparatus 10 of an embodiment, the treated member conveyance unit 40 (conveyance device) houses the table 31 or 32 (placement device) on which the treated member W is placed, into the chamber 20 (housing unit). Then, the table rotating shaft 31*b* or 32*b* (rotation device) and the attachment member rotating shaft 31*c* or 32*c* (rotation device) rotate the treated member W to face a direction facing the plasma production apparatus 21 (surface treatment device) or the sputtering apparatus 22 or 23 (surface treatment device) in a predetermined rotation pattern, in a state in which the treated member placement portion 30 is housed in the chamber 20. It is accordingly possible to provide a surface treatment apparatus suitable for performing surface treatment of the treated member W in amount from a small amount to a medium amount.

In addition, in the surface treatment apparatus 10 of an embodiment, the table 31 or 32 (placement device) includes the wall member 33 or 34 that closes the chamber 20 when the treated member placement portion 30 is housed into the chamber 20. It is therefore possible to sequentially execute the housing of the treated member W into the chamber 20 and a sealing operation of the chamber 20, by a series of operations.

In addition, in the surface treatment apparatus 10 of an embodiment, the table rotating shaft 31*b* or 32*b* (first rotation device) rotates the treated member placement portion 30 (placement device) to a direction in which the treated member W placed on the treated member placement portion 30 faces the plasma production apparatus 21 (surface treatment device) or the sputtering apparatus 22 or 23 (surface treatment device). In addition, the attachment member rotating shaft 31*c* or 32*c* (second rotation device) rotates the treated member W placed on the treated member placement portion 30 (placement device), to face a direction facing the plasma production apparatus 21 (surface treatment device)

or the sputtering apparatus 22 or 23 (surface treatment device). It is accordingly possible to uniformly perform surface treatment of the surface of the treated member W.

In addition, in the surface treatment apparatus 10 of an embodiment, at least one of the table rotating shaft 31*b* or 32*b* (first rotation device) or the attachment member rotating shaft 31*c* or 32*c* (second rotation device) rotates the treated member W in a predetermined rotation pattern. It is accordingly possible to set a rotation pattern suitable for the type of the treated member W or the type of surface treatment.

In addition, the surface treatment apparatus 10 of an embodiment includes a plurality of tables 31 and 32 (placement device), and the treated member placement portion rotating shaft 37 (selection device) selects one table to be housed into the chamber 20 (housing unit), out of the tables 31 and 32. It is accordingly possible to attach the treated member W to be treated next, to a table placed on the outside of the chamber 20, during the execution of surface treatment of the treated member W. It is therefore possible to efficiently use time.

In addition, in the surface treatment apparatus 10 of an embodiment, the treated member placement portion rotating shaft 37 (third rotation device) rotates a plurality of tables 31 and 32 installed on the same horizontal surface, up to the position facing a housing port of the chamber 20 (housing unit). It is accordingly possible to easily perform switching of the tables 31 and 32.

In addition, in the surface treatment apparatus 10 of an embodiment, the treated member W is attached to the attachment member 38 placed on the table 31 or 32 (placement device). It is accordingly possible to easily install the treated member W by an amount desired to be treated.

In addition, the surface treatment apparatus 10 of an embodiment includes the plasma production apparatus 21 (surface treatment device) that performs surface treatment of the treated member by irradiating the treated member W with plasma. It is accordingly possible to improve adhesion of a thin film to be formed in a subsequent process, by generating a functional group on the surface of the treated member W.

In addition, the surface treatment apparatus 10 of an embodiment includes the sputtering apparatuses 22 and 23 (surface treatment device) that perform sputtering on the treated member W. It is accordingly possible to form a desired thin film on the surface of the treated member W.

In addition, the surface treatment apparatus 10 of an embodiment includes the shutter 45 (shielding device) that shields, when one of a plurality of surface treatment devices (the plasma production apparatus 21, the sputtering apparatuses 22 and 23) performs surface treatment of the treated member W, another surface treatment device than the surface treatment device. It is accordingly possible to protect an electrode plane of surface treatment device that is not performing surface treatment on the treated member W.

EXPLANATIONS OF LETTERS OR NUMERALS

10 Surface Treatment Apparatus
20 Chamber (Housing Unit)
20*a*, 20*b*, 20*c*, 20*d* Standing Wall Surface
21 Plasma Production Apparatus (Surface Treatment Device)
22, 23 Sputtering Apparatus (Surface Treatment Device)
30 Treated Member Placement Portion
31, 32 Table (Placement Device)
31*a*, 32*a* Rotating Plate

31*b*, 32*b* Table Rotating Shaft (Rotation Device, First Rotation Device)
31*c*, 32*c* Attachment Member Rotating Shaft (Rotation Device, Second Rotation Device)
33, 34 Wall Member
35, 36 Floor Surface Member
37 Treated Member Placement Portion Rotating Shaft (Selection Device, Third Rotation Device)
38 Attachment Member
40 Treated Member Conveyance Unit (Conveyance Device)
41 Support Platform
42 Groove Portion
45 Shutter (Shielding Member)
50 Exhaust Apparatus
51 Cooling Apparatus
52 Control Apparatus
53 Power Supply Apparatus
54 Gas Supply Apparatus
55 Console Panel
56 Gas Flow Path
57 Gas Supply Hole
58 Gas Supply Line Attachment Member
59 Supporting Member
60, 62 Plate-Like Conductive Portion
61 Void Portion
63 Spacer
64, 77 Support Plate
66 Gas Supply Line
67 Recess Portion
69, 70 Through-Hole
73 Matching Box (MB)
74 High-Frequency Power Source (RF)
75 Ground
76 Mass Flow Controller (MFC)
78 Gas Supply Portion
79 Holding Member
80 Gas Introduction Portion
81 Cooling Water Pipe
82 Cooling Water Channel
83 Support Plate
84 Magnet
85 Cooling Jacket
86 Insulating Member
87 Target
88 Holding Member
90 Mirror
90*a* Al Layer
90*b* $SiO_2$ Layer
90*c* $Nb_2O_x$, Layer
P1, P2 Pressure
W Treated Member

The invention claimed is:

1. A surface treatment apparatus comprising:
a housing unit for housing a treated member;
a placement device on which the treated member is placed;
a conveyance device for conveying the placement device into the housing unit with the treated member placed thereon;
surface treatment devices which are installed inside the housing unit for performing at least one type of surface treatment on the treated member housed in the housing unit;
a first selection device for selecting one surface treatment device performs surface treatment on the treated member;

a rotation device for rotating the treated member to face a direction facing the surface treatment device in a predetermined rotation pattern, in a state in which the placement device is housed in the housing unit; and a shielding member having an opening only on a side of the surface treatment device selected by the first selection device and shield the treated member against a surface treatment device not selected by the first selection device.

2. The surface treatment apparatus according to claim 1, wherein the placement device includes a wall member for closing the housing unit when the placement device is housed in the housing unit.

3. The surface treatment apparatus according to claim 1, wherein the rotation device includes:

a first rotation device for rotating the placement device to face a direction in which the treated member placed on the placement device faces the surface treatment device; and a second rotation device for rotating the treated member placed on the placement device, to face the direction facing the surface treatment device.

4. The surface treatment apparatus according to claim 3, wherein at least one of the first rotation device and the second rotation device rotates the treated member in a predetermined rotation pattern.

5. The surface treatment apparatus according to claim 1, wherein the placement device includes a plurality of placement devices, and the surface treatment apparatus further comprises a second selection device for selecting one placement device to be housed into the housing unit, from among the plurality of placement devices.

6. The surface treatment apparatus according to claim 5, wherein the second selection device includes third rotation device for rotating the plurality of placement devices installed on a same horizontal surface, up to a position facing a housing port of the housing unit.

7. The surface treatment apparatus according to claim 1, wherein the treated member is attached to an attachment member placed on the placement device.

8. The surface treatment apparatus according to claim 1, wherein the surface treatment devices are a plasma production apparatus for performing surface treatment of the treated member by irradiating the treated member with plasma.

9. The surface treatment apparatus according to claim 1, wherein the surface treatment devices are a sputtering apparatus for performing sputtering on the treated member.

10. A surface treatment method comprising conveying a placement device having a treated member placed thereon, into a housing unit which has surface treatment devices for performing at least one type of surface treatment on the treated member;

selecting one surface treatment device to perform surface treatment on the treated member, the treated member to be treated and a surface treatment device not selected are shielded by a shielding member having an opening only on a side of the selected surface treatment device; and rotating the treated member to face a direction facing the selected surface treatment device in a predetermined rotation pattern, to perform the surface treatment.

* * * * *